(12) United States Patent
Zhu et al.

(10) Patent No.: US 11,386,246 B2
(45) Date of Patent: Jul. 12, 2022

(54) METHOD FOR DESIGNING HYBRID SURFACE OPTICAL SYSTEM

(71) Applicants: Tsinghua University, Beijing (CN); HON HAI PRECISION INDUSTRY CO., LTD., New Taipei (TW)

(72) Inventors: Jun Zhu, Beijing (CN); Tong-Tong Gong, Beijing (CN); Guo-Fan Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 1245 days.

(21) Appl. No.: 15/841,311

(22) Filed: Dec. 14, 2017

(65) Prior Publication Data
US 2018/0210981 A1    Jul. 26, 2018

(30) Foreign Application Priority Data
Jan. 24, 2017    (CN) .......................... 201710059418.3

(51) Int. Cl.
*G06F 30/20*    (2020.01)
*G02B 5/10*    (2006.01)
(Continued)

(52) U.S. Cl.
CPC ............... *G06F 30/20* (2020.01); *G02B 5/10* (2013.01); *G02B 27/0012* (2013.01); *G06F 30/23* (2020.01)

(58) Field of Classification Search
None
See application file for complete search history.

(56) References Cited

U.S. PATENT DOCUMENTS

| 10,437,943 B2 * | 10/2019 | Chrisp | .................... G06T 17/30 |
| 2015/0094993 A1 * | 4/2015 | Zhu | .......................... G02B 3/02 |
| | | | 703/1 |

(Continued)

FOREIGN PATENT DOCUMENTS

CN        103246053 A    8/2013

OTHER PUBLICATIONS

Yang, Tong, Jun Zhu, Xiaofei Wu, and Guofan Jin. "Direct design of freeform surfaces and freeform imaging systems with a point-by-point three-dimensional construction-iteration method." Optics express 23, No. 8 (2015): 10233-10246 (Year: 2015).*

(Continued)

*Primary Examiner* — Boris Gorney
*Assistant Examiner* — Robert S Brock
(74) *Attorney, Agent, or Firm* — ScienBiziP, P.C.

(57) ABSTRACT

A method for designing a hybrid surface optical system comprises establishing a first initial system; keeping the first initial system unchanged and calculating a plurality of first feature data points, and fitting the first feature data points to obtain a spherical surface; repeating such steps until all spherical surfaces are obtained; calculating a plurality of second feature data points, and fitting the plurality of second feature data points to obtain an aspheric surface; repeating such steps until all aspheric surfaces are obtained; calculating a plurality of third feature data points, and fitting the plurality of third feature data points to obtain a freeform surface; repeating such steps until all freeform surfaces are obtained.

15 Claims, 12 Drawing Sheets

(51) Int. Cl.
　　*G02B 27/00*　　(2006.01)
　　*G06F 30/23*　　(2020.01)

(56) References Cited

U.S. PATENT DOCUMENTS

| | | | | |
|---|---|---|---|---|
| 2015/0130806 | A1* | 5/2015 | Yang | G02B 27/0012 345/426 |
| 2016/0170191 | A1* | 6/2016 | Hou | G02B 17/0626 359/858 |
| 2018/0157017 | A1* | 6/2018 | Gong | G02B 17/0642 |
| 2020/0355912 | A1* | 11/2020 | Durr | G02B 27/0025 |

OTHER PUBLICATIONS

Challita, Zalpha, Tibor Agócs, Emmanuel Hugot, Attila Jaskó, Gabby Kroes, William Taylor, Chris Miller et al. "Design and development of a freeform active mirror for an astronomy application." Optical Engineering 53, No. 3 (2014): 031311, 11 pages (Year: 2014).*

Yang, Tong, Jun Zhu, Wei Hou, and Guofan Jin. "Design method of freeform off-axis reflective imaging systems with a direct construction process." Optics express 22, No. 8 (2014): 9193-9205, 13 pages (Year: 2014).*

Vasiljević, Darko. "The Cooke triplet optimizations." In Classical and Evolutionary Algorithms in the Optimization of Optical Systems, pp. 187-211. Springer, Boston, MA, 2002 (Year: 2002).*

Gong, Tongtong, Guofan Jin, and Jun Zhu. "Full-field point-by-point direct design method of off-axis aspheric imaging systems." Optics express 24, No. 26 (2016): 29417-29426 (Year: 2016).*

Gong, Tongtong, Guofan Jin, and Jun Zhu. "Point-by-point design method for mixed-surface-type off-axis reflective imaging systems with spherical, aspheric, and freeform surfaces." Optics express 25, No. 9 (2017): 10663-10676 (Year: 2017).*

Hou, Wei, Jun Zhu, Tong Yang, and Guofan Jin. "Construction method through forward and reverse ray tracing for a design of ultra-wide linear field-of-view off-axis freeform imaging systems." Journal of Optics 17, No. 5 (2015): 055603 (Year: 2015).*

Meng, Qingyu, Wei Wang, Hongcai Ma, and Jihong Dong. "Easy-aligned off-axis three-mirror system with wide field of view using freeform surface based on integration of primary and tertiary mirror." Applied optics 53, No. 14 (2014): 3028-3034 (Year: 2014).*

Tang, Ruirui, Benqi Zhang, Guofan Jin, and Jun Zhu. "Multiple surface expansion method for design of freeform imaging systems." Optics express 26, No. 3 (2018): 2983-2994 (Year: 2018).*

Zhu, Jun, Xiaofei Wu, Tong Yang, and Guofan Jin. "Generating optical freeform surfaces considering both coordinates and normals of discrete data points." JOSA A 31, No. 11 (2014): 2401-2408 (Year: 2014).*

Yang, Tong, Guo-Fan Jin, and Jun Zhu. "Automated design of freeform imaging systems." Light: Science & Applications 6, No. 10(2017): e17081-e17081. 10 pages (Year: 2017).*

* cited by examiner

METHOD FOR DESIGNING HYBRID SURFACE OPTICAL SYSTEM

CROSS-REFERENCE TO RELATED APPLICATIONS

This application claims all benefits accruing under 35 U.S.C. § 119 from China Patent Application No. 201710059418.3, field on Jan. 24, 2017 in the China Intellectual Property Office, disclosure of which is incorporated herein by reference. The application is also related to copending applications entitled, "OFF-AXIS HYBRID SURFACE THREE-MIRROR OPTICAL SYSTEM", filed on Dec. 14, 2017 (application Ser. No. 15/842,834).

FIELD

The present disclosure relates to a method for designing hybrid surface optical system.

BACKGROUND

In a condition of meeting the optical performance requirements of an optical system, using a spherical surface or an aspheric surface to replace a freeform surface of the optical system can reduce a cost and a difficulty of processing and testing. A hybrid surface optical system comprises different surfaces. Each surface of the hybrid surface optical system can be selected from spherical surface, aspheric surface, and freeform surfaces. Thus, compared to freeform surface optical systems, the hybrid surface optical system has low cost and small processing and testing difficulty.

However, conventional method for designing hybrid surface optical system is to obtain a coaxial spherical surface system by a paraxial optical theory first, and then the coaxial spherical surface system is transformed into an off-axis hybrid surface optical system during following optimization process. A deviation between the off-axis hybrid surface optical system obtained by conventional method and an ideal optical system is large.

BRIEF DESCRIPTION OF THE DRAWINGS

Implementations of the present technology will now be described, by way of example only, with reference to the attached figures.

DETAILED DESCRIPTION

Figure 1:
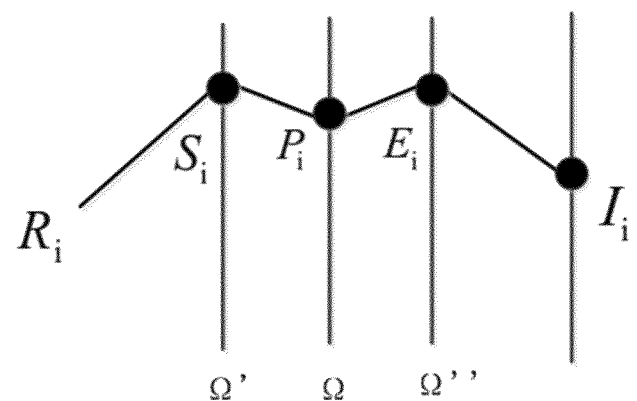
FIG. 1 is a schematic view of start point and end point of one feature ray while calculating the feature data points.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

A method for designing a hybrid surface optical system of one embodiment is provided. The method comprises the following steps:

step (S1), establishing a first initial system, wherein the first initial system comprises a plurality of initial surfaces, and each of the plurality of initial surfaces corresponds to a surface of an off-axis hybrid surface optical system to be calculated; and selecting a plurality of feature rays $R_i$ (i=1, 2 . . . K) from different fields and different aperture positions;

step (S2), a spherical surface of the off-axis hybrid surface optical system to be calculated is defined as a spherical surface "a", keeping the plurality of initial surfaces of the first initial system unchanged and calculating a plurality of first feature data points $(P_1, P_2, \ldots P_m)$ point by point, wherein m is less than K, and the plurality of first feature data points $(P_1, P_2, \ldots P_m)$ are m intersection points of the spherical surface "a" and m of the plurality of feature rays $R_i$ (i=1, 2 . . . K); and surface fitting the plurality of first feature data points $(P_1, P_2, \ldots P_m)$ to obtain an initial spherical surface $A_m$; calculating a (m+1)th first feature data point $P_{m+1}$ based on the initial spherical surface $A_m$, and surface fitting the (m+1) first feature data points $(P_1, P_2, \ldots P_m, P_{m+1})$ to obtain a spherical surface $A_{m+1}$; repeating such steps until a Kth first feature data point $P_K$ is calculated, and surface fitting the first feature data points $(P_1, P_2, \ldots P_K)$ to obtain a spherical surface $A_K$, wherein the spherical surface $A_K$ is the spherical surface "a"; repeating such steps until all spherical surfaces of the off-axis hybrid surface optical system to be calculated are obtained, to obtain a spherical surface optical system;

step (S3), an aspheric surface of the off-axis hybrid optical system to be calculated is defined as an aspheric surface "b", the spherical surface optical system is as a second initial system, keeping all spherical surfaces of the aspheric optical system unchanged and calculating a plurality of second feature data points $(P'_1, P'_2, \ldots P'_K)$, wherein the plurality of second feature data points $(P'_1, P'_2, \ldots P'_K)$ are the intersection points of the spherical surface "a" and the plurality of feature rays $R_i$ (i=1, 2 ... K); and surface fitting the plurality of second feature data points $(P'_1, P'_2, \ldots P'_K)$ to obtain the aspheric surface "b"; repeating such steps until all aspheric surfaces of the off-axis hybrid surface optical system to be calculated are obtained, to obtain a first hybrid surface optical system; and step (S4), a freeform surface of the off-axis hybrid optical system to be calculated is defined as a freeform surface "c", the first hybrid surface optical system is as a third initial system, keeping all aspheric surfaces of the first hybrid surface optical system unchanged and calculating a plurality of third feature data points $(P''_1, P''_2, \ldots P''_K)$, wherein the plurality of third feature data points $(P''_1, P''_2, \ldots P''_K)$ are the intersection points of the aspheric surface "b" and the plurality of feature rays $R_i$ (i=1, 2 ... K); and surface fitting the plurality of third feature data points $(P''_1, P''_2, \ldots P''_K)$ to obtain the freeform surface "c"; repeating such steps until all freeform surface s of the off-axis hybrid surface optical system to be calculated are obtained.

In step (S1), a premise for establishing the initial system is to eliminate obscuration. The initial surface can be a planar surface or a spherical surface. In one embodiment, the initial system comprises three initial surfaces; the three initial surfaces are a primary mirror initial surface, a secondary mirror initial surface and a tertiary mirror initial surface. Each of the primary mirror initial surface, the secondary mirror initial surface and the tertiary mirror initial surface is a planar surface with eccentricity and inclination.

A method for selecting the plurality of feature rays $R_i$ (i=1, 2 ... K) from different fields and different aperture positions comprises steps of: M fields are selected according to the optical systems actual needs; an aperture of each of the M fields is divided into N equal parts; and, P feature rays at different aperture positions in each of the N equal parts are selected. As such, K=M×N×P different feature rays correspond to different aperture positions and different fields are fixed. The aperture can be circle, rectangle, square, oval or other shapes. In one embodiment, the aperture of each of the M fields is a circle, and a circular aperture of each of the M fields is divided into N angles with equal interval φ, as such, N=2π/φ; then, P different aperture positions are fixed along a radial direction of each of the N angles. Therefore, K=M×N×P different feature rays correspond to different aperture positions and different fields are fixed. In one embodiment, fourteen fields are fixed in the construction process, the fourteen fields are (0°, −16°), (0°, −15°), (0°, −14°), (0°, −13°), (0°, −12°), (0°, −11°), (0°, −10°), (1.5°, −16°), (1.5°, −15°), (1.5°, −14°), (1.5°, −13°), (1.5°, −12°), (1.5°, −11°), and (1.5°, −10°); one hundred and twelve feature rays are fixed from each of the fourteen fields. Therefore, 1568 different feature rays correspond to different aperture positions and different fields are fixed.

Referring to FIG. 1, a surface $\Omega$ is defined as an unknown aspheric surface, a surface $\Omega'$ is defined as a surface located adjacent to and before the surface $\Omega$, and a surface $\Omega''$ is defined as a surface located adjacent to and behind the surface $\Omega$. Defining the intersection points of the plurality of feature rays $R_i$ (i=1, 2 ... K) with the surface $\Omega$ as the first feature data points $P_i$ (i=1, 2 ... K). The first feature data points $P_i$ (i=1, 2 ... K) can be obtained by the intersection points of the feature rays $R_i$ (i=1, 2 ... K) with the surface $\Omega'$ and the surface $\Omega''$. The plurality of feature rays $R_i$ (i=1, 2 ... K) are intersected with the surface $\Omega'$ at a plurality of start points $S_i$ (i=1, 2 ... K), and intersected with the surface $\Omega''$ at a plurality of end points $E_i$ (i=1, 2 ... K). When the surface $\Omega$ and the plurality of feature rays $R_i$ (i=1, 2 ... K) are determined, the plurality of start points $S_i$ (i=1, 2 ... K) of the feature rays $R_i$ (i=1, 2 ... K) can also be determined. The plurality of end points $E_i$ (i=1, 2 ... K) can be obtained based on the object-image relationship. Under ideal conditions, the feature rays $R_i$ (i=1, 2 ... K) emitted from the plurality of start points $S_i$ (i=1, 2 ... K) on the surface $\Omega'$; pass through the first feature data points $P_i$ (i=1, 2 ... K) on the surface $\Omega$; intersect with the surface $\Omega''$ at the plurality of end points $E_i$ (i=1, 2 ... K); and finally intersect with the image plane at the plurality of ideal image points $I_i$ (i=1, 2 ... K). When the surface $\Omega$ is a tertiary mirror, a plurality of intersection points of the plurality of feature rays $R_i$ (i=1, 2 ... K) and a secondary mirror are the plurality of start points $S_i$ (i=1, 2 ... K), a plurality of intersection points of the plurality of feature rays $R_i$ (i=1, 2 ... K) and the image plane are the plurality of end points $E_i$ (i=1, 2 ... K), and the plurality of end points $E_i$ (i=1, 2 ... K) are the plurality of ideal image points $I_i$ (i=1, 2 ... K). When the surface $\Omega$ is the secondary mirror, a plurality of intersection points of the plurality of feature rays $R_i$ (i=1, 2 ... K) and a primary mirror are the plurality of start points $S_i$ (i=1, 2 ... K), the plurality of end points $E_i$ (i=1, 2 ... K) are the points on the tertiary mirror which minimizes an optical path length between the plurality of first feature data points $P_i$ (i=1, 2 ... K) and the plurality of ideal image points $I_i$ (i=1, 2 ... K). When the surface $\Omega$ is the primary mirror, the plurality of end points $E_i$ (i=1, 2 ... K) are the points on the secondary mirror which minimizes an optical path length between the plurality of feature data points $P_i$ (i=1, 2 ... K) and the plurality of ideal image points $I_i$ (i=1, 2 ... K).

In step (S2), a value of m is selected to improve an accuracy of the aspheric surface fitting. In one embodiment, the value of m can be ranged from about K/3 to about 2K/3. If the value of m is too small, such as less than K/3, a surface fitting error will be large; on the contrary, if the value of m is too large, such as large than 2K/3, the subsequent feature data points are few, which is not conducive to further reduce the fitting surface error. In one embodiment, the value of m is about K/2=784.

A method for calculating the plurality of first feature data points $(P_1, P_2, \ldots P_m)$ includes the following sub-steps:

Step (a): defining a first intersection point of a first feature ray $R_i$ and the spherical surface "a" as the first feature data point $P_i$;

Step (b): when an ith (1≤i≤m−1) first feature data point $P_i$ (1≤i≤m−1) has been obtained, a unit normal vector $\vec{N}_i$ at the ith (1≤i≤m−1) first feature data point $P_i$ (1≤i≤m−1) can be calculated based on the vector form of Snell's Law;

Step (c): making a first tangent plane through the ith (1≤i≤m−1) first feature data point $P_i$ (1≤i≤m−1); and (m−i) second intersection points can be obtained by the first tangent plane intersects with remaining (m−i) feature rays;

a second intersection point $Q_{i+1}$, which is nearest to the ith ($1 \le i \le m-1$) feature data point $P_i$ ($1 \le i \le m-1$), is fixed; and a feature ray corresponding to the second intersection point $Q_{i+1}$ is defined as $R_{i+1}$, a shortest distance between the second intersection point $Q_{i+1}$ and the ith ($1 \le i \le m-1$) first feature data point $P_i$ ($1 \le i \le m-1$) is defined as $d_i$;

Step (d): making a second tangent plane at (i−1) first feature data points that are obtained before the ith first feature data point $P_i$ ($1 \le i \le m-1$) respectively; thus, (i−1) second tangent planes can be obtained, and (i−1) third intersection points can be obtained by the (i−1) second tangent planes intersecting with a feature ray $R_{i+1}$; in each of the (i−1) second tangent planes, each of the third intersection points and its corresponding feature data point form an intersection pair; the intersection pair, which has the shortest distance between a third intersection point and its corresponding feature data point, is fixed; and the third intersection point and the shortest distance is defined as $Q'_{i+1}$ and $d'_i$ respectively;

Step (e): comparing $d_i$ and $d'_i$, if $d_i \le d'_i$, $Q_{i+1}$ is taken as the next first feature data point $P_{i+1}$ ($1 \le i \le m-1$); otherwise, $Q'_{i+1}$ is taken as the next first feature data point $P_{i+1}$ ($1 \le i \le m-1$); and Step (f): repeating steps from b to e, until the plurality of first feature data points $P_i$ (i=1, 2 . . . m) are all calculated.

In step (b), the unit normal vector $\vec{N}_i$ ($1 \le i \le m-1$) at each of the first feature data point $P_i$ ($1 \le i \le m-1$) can be calculated based on the vector form of Snell's Law. When the surface $\Omega$ is a refractive surface, $$\vec{N}_i = \frac{n'\vec{r}'_i - n\vec{r}_i}{|n'\vec{r}'_i - n\vec{r}_i|},$$

wherein $$\vec{r}_i = \frac{\overrightarrow{P_i S_i}}{|\overrightarrow{P_i S_i}|}$$

the surface $\Omega$;

$$\vec{r}'_i = \frac{\overrightarrow{E_i P_i}}{|\overrightarrow{E_i P_i}|}$$

is a unit vector along a direction of an incident ray of the surface $\Omega$; is a unit vector along a direction of an exit ray of the surface $\Omega$; and n, n' is refractive index of a media at two opposite sides of the surface $\Omega$ respectively.

Similarly, when the surface $\Omega$ is a reflective surface, $$\vec{N}_i = \frac{\vec{r}'_i - \vec{r}_i}{|\vec{r}'_i - \vec{r}_i|}$$

The unit normal vector $\vec{N}_i$ at the first feature data points $P_i$ (i=1, 2 . . . m) is perpendicular to the first tangent plane at the feature data points $P_i$ (i=1, 2 . . . m). Thus, the first tangent planes at the first feature data points $P_i$ (i=1, 2 . . . m) can be obtained.

Figure 2:
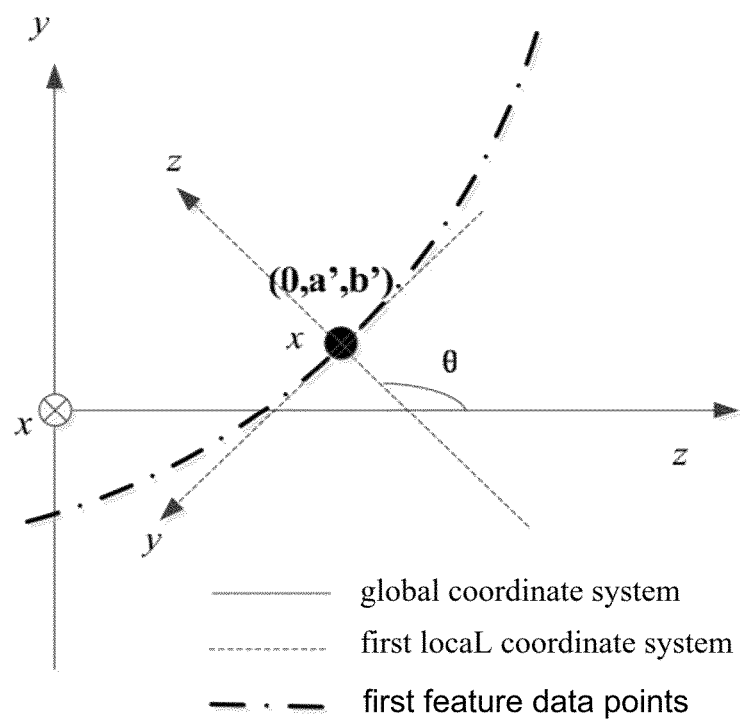
FIG. 2 is a position diagram of one embodiment of a global coordinate system and a first local coordinate system.

Referring to FIG. 2, a global coordinate system is defined by a primary mirror location. A beam propagation direction is defined as a Z-axis. A plane perpendicular to the Z-axis is defined as an xy plane.

Figure 3:
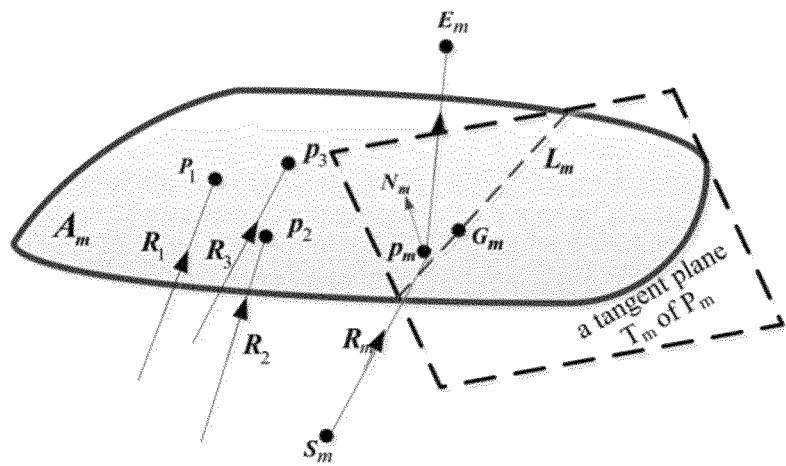
FIG. 3 is a schematic view of one embodiment of calculating an intermediate point $G_m$.

Referring to FIG. 3, during calculating the plurality of first feature data points ($P_1, P_2, \ldots P_m$), a intermediate point $G_m$ is calculated. A method for calculating the intermediate point $G_m$ comprises: a tangent plane $T_m$ at the first feature data point $P_m$ is calculated, the tangent plane $T_m$ intersects with the initial spherical surface $A_m$ at an intersection line $L_m$; and in the global coordinate system, a first feature data point located on the intersection line $L_m$ whose x coordinate is the same as an x coordinate of the first feature data point $P_m$ is defined as the intermediate point $G_m$.

The first feature data point $P_{m+1}$ is an intersection point between its corresponding feature ray and a tangent plane of the first feature data points ($P_1, P_2, \ldots P_m$) that is closest to the feature data point $P_{m+1}$.

Figure 4:
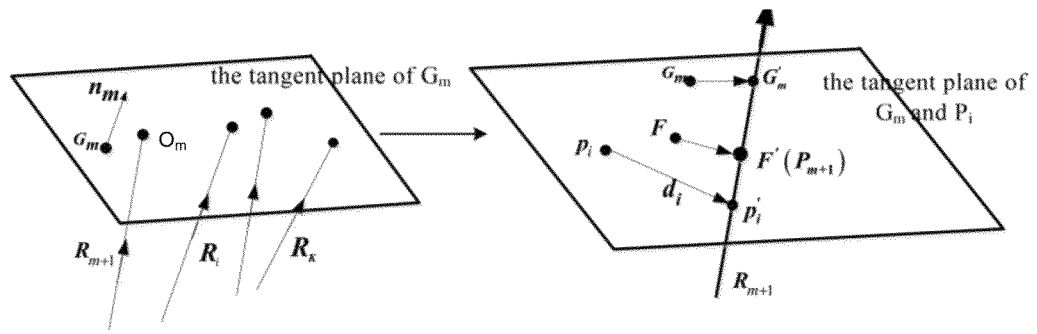
FIG. 4 is a schematic view of one embodiment of calculating a feature data point $P_{m+1}$.

Referring to FIG. 4, a method for calculating the (m+1)th first feature data point $P_{m+1}$ comprises the sub steps: first, finding the feature ray corresponding to the (m+1)th first feature data point $P_{m+1}$, wherein the feature ray corresponding to the (m+1)th first feature data point $P_{m+1}$ is nearest to the intermediate point $G_m$ in the remaining K−m characteristic rays. Since the intermediate point $G_m$ is located on the initial spherical surface $A_m$, a normal vector $n_m$ and a tangent plane of the intermediate point $G_m$ at the initial spherical surface $A_m$ can be obtained according to an spherical surface expression. (K−m) intersection points can be obtained by the tangent plane of the intermediate point $G_m$ intersecting with remaining (K−m) feature rays, an intersection point $O_m$, which is nearest to the intermediate point $G_m$ is fixed from the (K−m) intersection points; the feature ray where the intersection point $O_m$ is located on is the feature ray $R_{m+1}$ that corresponds to the feature data point $P_{m+1}$. Second, m intersection points $O_i$ ($1 \le i \le m$) can be obtained by the feature ray $R_{m+1}$ intersects with each of the tangent planes of the first feature data points ($P_1, P_2 \ldots P_m$), and an intersection point $G'_m$ can be obtained by the feature ray $R_{m+1}$ intersects with the intermediate point $G_m$. The first feature data points ($P_1, P_2 \ldots P_m$) and the intermediate point $G_m$ are defined as "F"; the m intersection points $O_i$ ($1 \le i \le m$) and the intersection point $G'_m$ are defined as "F'". A pair of (F−F') which has shortest distance is found from ($P_1, P_2 \ldots P_m$)−$O_i$ and $G'_m$−$G_m$. The point F is closest to the first feature data point $P_{m+1}$, and the point F' is the next first feature data point $P_{m+1}$.

The methods for calculating the first feature data points $P_{m+2}$ and $P_K$ are the same as the method for calculating the first feature data point $P_{m+1}$. A method for calculating an intermediate point $G_{m+1}$ in a process of calculating the first feature data point $P_{m+2}$ and a method for calculating an intermediate point $G_{K-1}$ in a process of calculating the first feature data point $P_K$ are the same as the method for calculating the intermediate point $G_m$.

A method for surface fitting the first feature data points ($P_1, P_2 \ldots P_m$) to obtain the initial spherical surface $A_m$, a method for surface fitting the (m+1) first feature data points ($P_1, P_2, \ldots P_m, P_{m+1}$) to obtain the spherical surface $A_{m+1}$, and a method for surface fitting the first feature data points ($P_1, P_2, \ldots P_K$) to obtain the spherical surface $A_K$ are all least squares method.

A coordinate of the first feature data point is ($x_i, y_i, z_i$), and its corresponding normal vector is ($u_i, v_i, -1$). When a sphere center is (A, B, C) and a radius is r, An equation of the spherical surface can be expressed by equation (1):

$$(x_i - A)^2 + (y_i - B)^2 + (z_i - C)^2 = r^2 \qquad (1).$$

Calculating a derivation of the equation (1) for x and y, to obtain an expression of a normal vector $u_i$ in an x-axis direction and an expression of a normal vector $v_i$ in a y-axis direction.

$$\left(1 + \frac{1}{u_i^2}\right)(x_i - A)^2 + (y_i - B)^2 = r^2, \quad (2)$$

$$(x_i - A)^2 + \left(1 + \frac{1}{v_i^2}\right)(y_i - B)^2 = r^2. \quad (3)$$

Equations (1) (2) and (3) can be rewrite into the matrix form, and equations (4) (5) and (6) of center coordinates can be obtained through a matrix transformation.

$$\begin{bmatrix} \sum(x_i(x_i - \bar{x})) & \sum(x_i(y_i - \bar{y})) & \sum(x_i(z_i - \bar{z})) \\ \sum(x_i(y_i - \bar{y})) & \sum(y_i(y_i - \bar{y})) & \sum(y_i(z_i - \bar{z})) \\ \sum(x_i(z_i - \bar{z})) & \sum(y_i(z_i - \bar{z})) & \sum(z_i(z_i - \bar{z})) \end{bmatrix} \begin{bmatrix} 2A \\ 2B \\ 2C \end{bmatrix} = \begin{bmatrix} \sum((x_i^2 + y_i^2 + z_i^2)(x_i - \bar{x})) \\ \sum((x_i^2 + y_i^2 + z_i^2)(y_i - \bar{y})) \\ \sum((x_i^2 + y_i^2 + z_i^2)(z_i - \bar{z})) \end{bmatrix}, \quad (4)$$

$$\begin{bmatrix} \sum U_i(U_i - \bar{U}) & \sum U_i(y_i - \bar{y}) & 0 \\ \sum U_i(y_i - \bar{y}) & \sum y_i(y_i - \bar{y}) & 0 \\ 0 & 0 & 0 \end{bmatrix} \begin{bmatrix} 2A \\ 2B \\ 2C \end{bmatrix} = \begin{bmatrix} \sum(U_i x_i + y_i^2)(U_i - \bar{U}) \\ \sum(U_i x_i + y_i^2)(y_i - \bar{y}) \\ 0 \end{bmatrix}, \quad (5)$$

$$\begin{bmatrix} \sum x_i(x_i - \bar{x}) & \sum V_i(x_i - \bar{x}) & 0 \\ \sum V_i(x_i - \bar{x}) & \sum V_i(V_i - \bar{V}) & 0 \\ 0 & 0 & 0 \end{bmatrix} \begin{bmatrix} 2A \\ 2B \\ 2C \end{bmatrix} = \begin{bmatrix} \sum(x_i^2 + V_i y_i)(x_i - \bar{x}) \\ \sum(x_i^2 + V_i y_i)(V_i - \bar{V}) \\ 0 \end{bmatrix}. \quad (6)$$

The normal vector $(u_i, v_i, -1)$ decides a direction of light rays, thus, both a coordinate error and a normal error during the surface fitting should be considered to obtain an accurate spherical surface. The coordinate error and the normal error are linearly weighted to calculate the sphere center (A, B, C) and the radius r.

Equation (4)+ω×equation (5)+ω×equation (6)     (7),

Equation (1)+ω×equation (2)+ω×equation (3)     (8), wherein, ω is a weight of the normal error. The sphere center (A, B, C) can be obtained by equation (7), and the radius r can be obtained by equation (8).

Figure 5:
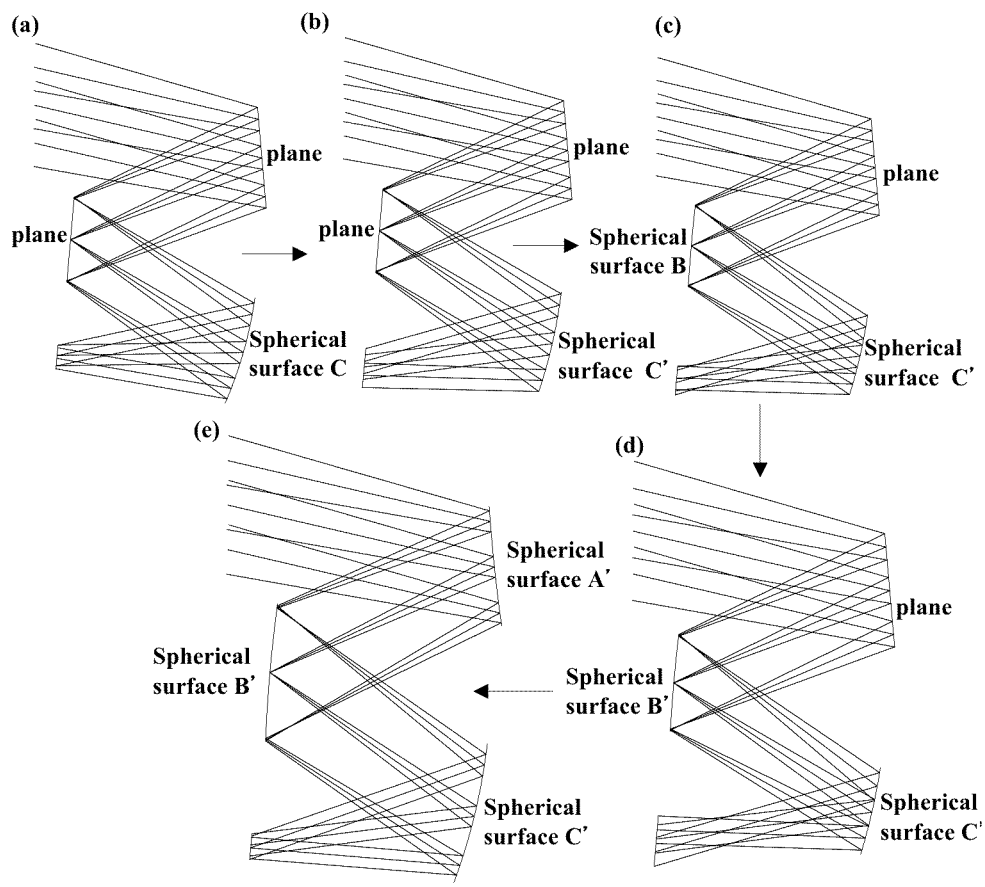
FIG. 5 is a schematic view of one embodiment of calculating an off-axis spherical surface three-mirror optical system.

After the spherical surface "a" is obtained, the radius of the spherical surface "a" can be further changed to obtain a spherical surface "a'", an optical power of the spherical surface "a" is changed. In one embodiment, $r_a' = \varepsilon_a \times r_a$, $\varepsilon_a = 0.5 \sim 1.5$, wherein $r_a$ is the radius of the spherical surface "a", and $r_a'$ is the radius of the spherical surface "a'". The radius of each of the spherical surfaces of the off-axis hybrid surface optical system can be further changed to change the optical power each of the spherical surfaces. Referring to FIG. 5, in one embodiment, a spherical surface "C" is obtained by the method like in step S2, a spherical surface "C'" is obtained by changing a radius of the spherical surface "C"; the primary mirror initial plane and the spherical surface "C'" are kept unchanged to solve a spherical surface "B", and a spherical surface "B'" is obtained by changing a radius of the spherical surface "B"; the spherical surface "B'" and the spherical surface "C'" are kept unchanged to solve a spherical surface "A", and a spherical surface "A'" is obtained by changing a radius of the spherical surface "A", therefore, a spherical three-mirror optical system comprising the spherical surface "A'", the spherical surface "B'" and the spherical surface "C'" is obtained.

In step (S3), the normal vector N=(U,V,−1) determines a deflection direction of light rays. If a normal surface fitting error is large, a propagation path of the feature ray will deviate from an expected direction. Therefore, both a coordinate error and a normal error during the surface fitting the plurality of second feature data points (P'$_1$, P'$_2$, P'$_K$) should be considered. A unit normal vector of each of the plurality of second feature data points (P'$_1$, P'$_2$, P'$_K$) is obtained based on the object-image relationship, and the coordinates and normal of the K second feature data points are surface fitted.

A method for calculating the unit normal vector at each of the second feature data points is the same as the method for calculating the unit normal vector at each of the first feature data points.

A first local coordinate system is defined with a center of the aspheric surface (0, a', b') as an origin and an aspherical symmetry axis as a Z-axis. The first local coordinate system xyz can be described by the parameters (a, b, θ), wherein θ is a rotation angle of the first local coordinate system relative to the global coordinate system.

The coordinate error and the normal error are linearly weighted, and an error evaluation function J is proposed:

$$\begin{aligned} J &= \sum(Z - z)^2 + \omega \times \sum(U - u)^2 + \omega \times \sum(V - v)^2 \\ &= (z - A_1 P)^T(z - A_1 P) + \omega(u - A_2 P)^T(v - A_2 P) + \\ &\quad \omega(v - A_3 P)^T(v - A_3 P), \end{aligned} \quad (10)$$

wherein Z is a surface fitting coordinate, (U, V, −1) is the surface fitting normal vector, z is a real coordinate, (u, v, −1) is a real normal vector, ω is a weight of the normal error, P is an coefficient matrix (A, B, C, D . . . ) of the aspheric surface "b", $A_1$ is a matrix ($r^2, r^4, r^6, r^8$ . . . ), $A_2$ is a matrix obtained by calculating the partial derivatives of $A_1$ with respect to x, and $A_3$ is a matrix obtained by calculating the partial derivatives of $A_1$ with respect to y.

When the error evaluation function J is smallest, a calculating equation of the coefficient matrix P is:

$$P = (A_1^T A_1 + \omega A_2^T A_2 + \omega A_3^T A_3)^{-1}(A_1^T z + \omega A_2^T u + \omega A_3^T v) \quad (11).$$

A method for surface fitting the second feature data points (P'$_1$, P'$_2$, . . . P'$_K$) to obtain the aspheric surface "b" comprising the sub-step:

step (S31), transferring the coordinates ($x_0, y_0, z_0$) of the second feature data points (P'$_1$, P'$_2$, . . . P'$_K$) and their corresponding normal vectors ($\alpha_0, \beta_0, \gamma_0$) in the global coordinate system to the coordinates (x, y, z) and their corresponding normal vectors (α, β, γ) in the first local coordinate system; and step (S32), performing the least squares fitting in the first local coordinate system xyz.

In step (S31), a relationship between the coordinates ($x_0, y_0, z_0$) in the global coordinate system $x_0 y_0 z_0$ and the coordinates (x, y, z) in the first local coordinate system xyz can be written as:

$$\begin{cases} x = x_0 \\ y = (y_0 - a)\cos\theta - (z_0 - b)\sin\theta \\ z = (y_0 - a)\sin\theta + (z_0 - b)\cos\theta \end{cases}$$

A relationship between the normal vectors ($\alpha_0$, $\beta_0$, $\gamma_0$) in the global coordinate system and normal vectors ($\alpha$, $\beta$, $\gamma$) in the first local coordinate system xyz can be written as:

$$\begin{cases} u = u_0 \\ v = v_0\cos\theta - w_0\sin\theta \\ w = v_0\sin\theta + w_0\cos\theta \end{cases}$$

In one embodiment, a number of the first local coordinate system positions are obtained by using a local search algorithm near the second feature data points, from which a first local coordinate system with the smallest surface fitting error is chosen, and a z-axis of the first local coordinate system with the smallest surface fitting error is as a symmetry axis of the aspheric surface "b".

Figure 6:
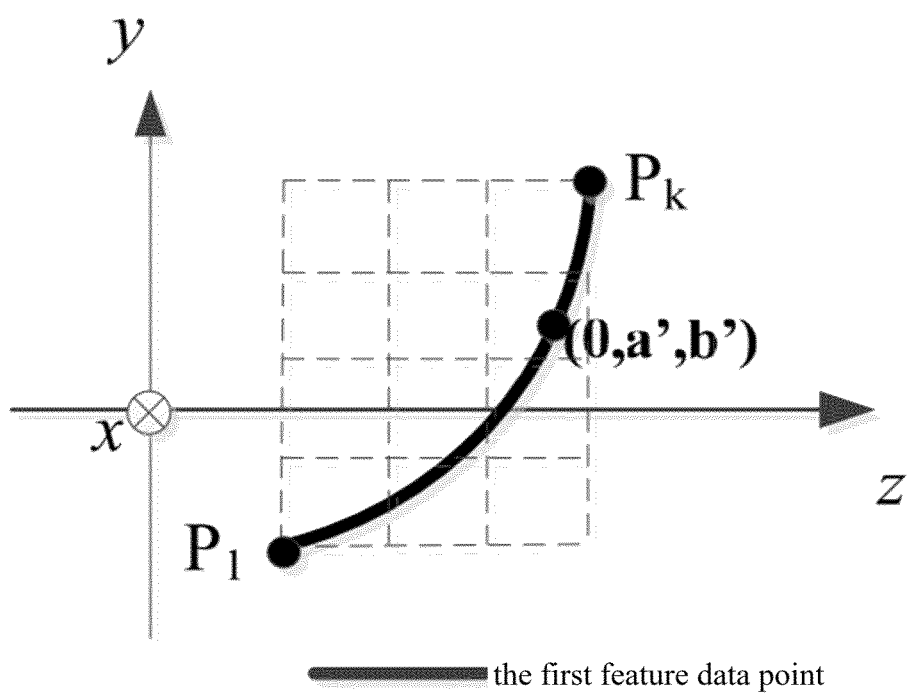
FIG. 6 is a schematic view of one embodiment of determining the parameters of the first local coordinate system.

Referring to FIG. 6, a value of the aspheric vertex coordinates (0, a', b') is obtained by using a local search algorithm in a rectangle with a diagonal of the connection between the second feature data points P'$_1$ and P'$_K$. In one embodiment, a grid mesh is generated in the rectangle with the diagonal of the connection between the second feature data points P'$_1$ and P'$_K$, a grid node is a value of the vertex coordinates (0, a', b') of the aspheric surface "b", and a grid size is a step size of (0, a', b'). In one embodiment, the step size of (0, a', b') is about 0.2 mm. A value of the rotation angle $\theta$ can be ranged from about $-\pi$ to about $\pi$ for each set of (a', b'). Therefore, a plurality of parameters (a', b', $\theta$) correspond to a plurality of first local coordinate system positions can be obtained.

For each of the plurality of parameters (a', b', $\theta$), the coefficient matrix P (A, B, C, D . . . ) can be obtained by equation (11), and its corresponding J is known by equation (10). Selecting a parameter (a', b', $\theta$) whose corresponding J is the smallest and defining it as an optimal local coordinate position parameter, and the first local coordinate system is established using the optimal local coordinate position parameter.

The coefficient matrix P (A, B, C, D . . . ) is substituted into the following equation (12) to obtain the aspheric surface "b", $$Z = Ar^2 + Br^4 + Cr^6 + Dr^8 + \ldots \quad r^2 = x^2 + y^2 \quad (12)$$

$$A = \frac{1}{2}c, B = a_1 + \frac{1}{8}(k+1)c^3, C = a_2 + \frac{1}{16}(k+1)^2c^5,$$

$$D = a_3 + \frac{5}{128}(k+1)^3c^7,$$

wherein, L is a more than eighth order term about r. Since an order of L term is too high, a processing of the aspheric surface "b" is more difficult, so the L item can be directly omitted in the actual calculation.

In step (S4), both a coordinate error and a normal error during surface fitting the plurality of third feature data points (P''$_1$, P''$_2$, . . . P''$_K$) should be considered. A unit normal vector of each of the plurality of third feature data points (P''$_1$, P''$_2$, . . . P''$_K$) is obtained based on the object-image relationship, and the coordinates and normal of the K third feature data points are surface fitted.

A method for calculating the unit normal vector at each of the third feature data points is the same as the method for calculating the unit normal vector at each of the first feature data points.

A method for surface fitting the plurality of third feature data points (P''$_1$, P''$_2$, . . . P''$_K$) to obtain the freeform surface "c" comprising the sub-step:

step (S41), surface fitting the plurality of third feature data points to a sphere in the global coordinate system, and obtaining a curvature c of the sphere and a curvature center ($x_c$, $y_c$, $z_c$) corresponding to the curvature c of the sphere;

step (S42), defining a feature data point ($x_o$, $y_o$, $z_o$) corresponding to a chief ray of the central field angle among the entire field-of-view (FOV) as the vertex of the sphere, defining a second local coordinate system by the vertex of the sphere as origin and a line passing through the curvature center and the vertex of the sphere as a Z-axis;

step (S43), transforming the coordinates ($x_i$, $y_i$, $z_i$) and the normal vector ($\alpha_i$, $\beta_i$, $\gamma_i$), of the plurality of third feature data points in the global coordinate system, into the coordinates ($x'_i$, $y'_i$, $z'_i$) and the normal vector ($\alpha'_i$, $\beta'_i$, $\gamma'_i$), of the plurality of third feature data points in the second local coordinate system;

step (S44), surface fitting the plurality of third feature data points into the conic surface in the second local coordinate system, based on the coordinates ($x'_i$, $y'_i$, $z'_i$) and the curvature c of the sphere, and obtaining the conic constant k; and step (S45), removing the coordinates and the normal vector of the plurality of third feature data points $P_i$ (i=1, 2 . . . K), on the conic surface in the second local coordinate system, from the coordinates ($x'_i$, $y'_i$, $z'_i$) and the normal vector ($\alpha'_i$, $\beta'_i$, $\gamma'_i$), to obtain a residual coordinate and a residual normal vector; and surface fitting the residual coordinate and the residual normal vector to obtain a freeform surface; the equation of the freeform surface "c" can be obtained by adding an conic surface equation and an freeform surface equation.

Generally, the optical systems are symmetric about the yoz plane. Therefore, a tilt angle $\theta$ of the sphere, in the yoz plane of the second local coordinate system relative to in the yoz plane of the global coordinate system, is:

$$\theta = \arctan\left(\frac{y_o - y_c}{z_o - z_c}\right).$$

A relationship between the coordinates ($x'_i$, $y'_i$, $z'_i$) and the coordinates ($x_i$, $y_i$, $z_i$) of each of the plurality of third feature data points can be expressed as following:

$$\begin{cases} x'_i = x_i - x_o \\ y'_i = (y_i - y_o)\cos\theta - (z_i - z_o)\sin\theta \\ z'_i = (y_i - y_o)\sin\theta + (z_i - z_o)\cos\theta \end{cases}$$

A relationship between the normal vector ($\alpha'_i$, $\beta'_i$, $\gamma'_i$) and the normal vector ($\alpha_i$, $\beta_i$, $\gamma_i$) of each of the plurality of third feature data points can be expressed as following:

$$\begin{cases} \alpha'_i = \alpha_i \\ \beta'_i = \beta_i\cos\theta - \gamma_i\sin\theta \\ \gamma'_i = \beta_i\sin\theta + \gamma_i\cos\theta \end{cases}$$

In the second local coordinate system, the coordinates and the normal vector of the plurality of third feature data points on the conic surface are defined as $(x'_i, y'_i, z'_{is})$ and $(\alpha'_{is}, \beta'_{is}, \gamma'_{is})$ respectively. An Z'-axis component of the normal vector is normalized to −1. The residual coordinate $(x''_i, y''_i, z''_i)$ and the residual normal vector $(\alpha''_i, \beta''_i, -1)$ can be obtained, wherein, $(x''_i, y''_i, z''_i) = (x'_i, y'_i, z'_{is})$ and $$(\alpha''_i, \beta''_i, -1) = \left(-\frac{\alpha'_i}{\gamma'_i} + \frac{\alpha'_{is}}{\gamma'_{is}}, -\frac{\beta'_i}{\gamma'_i} + \frac{\beta'_{is}}{\gamma'_{is}}, -1\right).$$

In step (S45), a method of surface fitting the residual coordinate and the residual normal vector comprises:

step (S451): in the second local coordinate system, expressing a polynomial surface by the polynomial surface equation leaving out the conic surface term, the polynomial surface can be expressed in terms of the following equation:

$$z = f(x, y; P) = \sum_{j=1}^{J} P_j g_j(x, y),$$

wherein $g_j(x, y)$ is one item of the polynomial, and $P = (p_1, p_2, \ldots p_J)^T$ is the coefficient sets;

step (S452): acquiring a first sum of squares $d_1(P)$, of residual coordinate differences in z' direction between the residual coordinate value $(x''_i, y''_i, z''_i)$ (i=1, 2, ..., K) and the freeform surface; and a second sum of squares $d_2(P)$, of modulus of vector differences between the residual normal vector $N_i = (\alpha''_i, \beta''_i, -1)$ (i=1, 2, ..., K) and a normal vector of the freeform surface, wherein the first sum of squares $d_1(P)$ is expressed in terms of a first equation:

$$d_1(P) = \sum_{i=1}^{I} [z_i - f(x''_i, y''_i; P)]^2 = (Z - A_1 P)^T (Z - A_1 P),$$

and the second sum of squares $d_2(P)$ is expressed in terms of a second equation:

$$d_2(P) = \sum_{i=1}^{I} \{[u_i - f_{x''}(x''_i, y''_i; P)]^2 + [v_i - f_{y''}(x''_i, y''_i; P)]^2\} = (U - A_2 P)^T (U - A_2 P) + (V - A_3 P)^T (V - A_3 P);$$

wherein, $Z = (z_1, z_2, \ldots, z_I)^T$, $U = (u_1, u_2, \ldots, u_I)^T$, $V = (v_1, v_2, \ldots, v_I)^T$, $$A_1 = \begin{pmatrix} g_1(x''_1, y''_1) & g_2(x''_1, y''_1) & \cdots & g_J(x''_1, y''_1) \\ g_1(x''_2, y''_2) & g_2(x''_2, y''_2) & \cdots & g_J(x''_2, y''_2) \\ \vdots & \vdots & & \vdots \\ g_1(x''_I, y''_I) & g_2(x''_I, y''_I) & \cdots & g_J(x''_I, y''_I) \end{pmatrix},$$

$$A_2 = \begin{pmatrix} g_1^x(x''_1, y''_1) & g_2^x(x''_1, y''_1) & \cdots & g_J^x(x''_1, y''_1) \\ g_1^x(x''_2, y''_2) & g_2^x(x''_2, y''_2) & \cdots & g_J^x(x''_2, y''_2) \\ \vdots & \vdots & & \vdots \\ g_1^x(x''_I, y''_I) & g_2^x(x''_I, y''_I) & \cdots & g_J^x(x''_I, y''_I) \end{pmatrix},$$

$$A_3 = \begin{pmatrix} g_1^y(x''_1, y''_1) & g_2^y(x''_1, y''_1) & \cdots & g_J^y(x''_1, y''_1) \\ g_1^y(x''_2, y''_2) & g_2^y(x''_2, y''_2) & \cdots & g_J^y(x''_2, y''_2) \\ \vdots & \vdots & & \vdots \\ g_1^y(x''_I, y''_I) & g_2^y(x''_I, y''_I) & \cdots & g_J^y(x''_I, y''_I) \end{pmatrix};$$

step (S453): obtaining an evaluation function, $P = (A_1^T A_1 + wA_2^T A_2 + wA_3^T A_3)^{-1} \cdot (A_1^T Z + wA_2^T U + wA_3^T V)$, wherein w is a weighting greater than 0;

step (S454): selecting different weightings w and setting a gradient $\nabla f(P)$ of the evaluation function equal to 0, to obtain a plurality of different values of P and a plurality of freeform surface shapes $z = f(x, y; P)$ corresponding to each of the plurality of different values of P; and step (S455): choosing a final freeform surface shape $\Omega_{opt}$ which has a best imaging quality from the plurality of freeform surface shapes $z = f(x, y; P)$.

Furthermore, a step of optimizing the hybrid surface optical system obtained after step (S4) can be performed, and the hybrid surface optical system obtained after step (S4) can be as the initial system.

Figure 7:
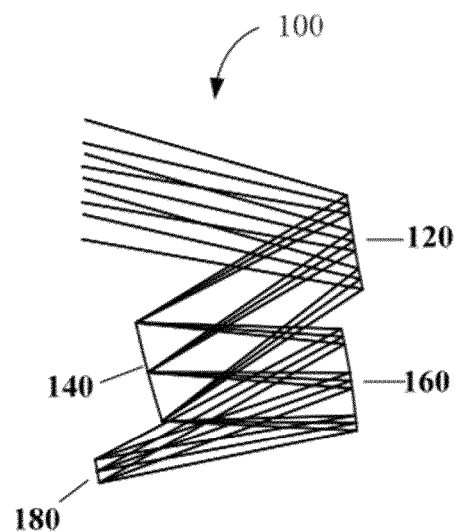
FIG. 7 is a schematic view of one embodiment of a configuration of an off-axis hybrid surface three-mirror optical system.

Referring to FIG. 7, an off-axis hybrid surface three-mirror optical system 100 is designed with the above method to prove the above method. The off-axis hybrid surface three-mirror optical system 100 comprises a primary mirror 120, a secondary mirror 140, a tertiary mirror 160 and an image sensor 180 located in that order and spaced from each other. The secondary mirror 140 is used as a stop surface. A surface shape of the primary mirror 120 is a freeform surface. A surface shape of the secondary mirror 140 is an aspheric surface. A surface shape of the tertiary mirror 160 is a spherical surface. The feature rays exiting from the light source would be successively reflected by the primary mirror 120, the secondary mirror 140 and the tertiary mirror 160 to form an image on the image sensor 180. The parameters of the off-axis hybrid surface three-mirror optical system 100 are shown in table 1 below.

TABLE 1

| Parameters | Values |
|---|---|
| Field of View | 3° × 6° (an angle in a meridian direction is in a range from −16° to −10°) |
| F-number | 2.2 |
| entrance pupil diameter | 100 mm |
| Wave Range | Long-wave infrared (8-12 μm) |

In one embodiment, fourteen off-axial fields are selected during a designing process of the off-axis hybrid surface three-mirror optical system 100. The fourteen off-axial fields are (0°, −16°), (0°, −15°), (0°, −14°), (0°, −13°), (0°, −12°), (0°, −11°), (0°, −10°), (1.5°, −16°), (1.5°, −15°), (1.5°, −14°), (1.5°, −13°), (1.5°, −12°), (1.5°, −11°, and (1.5°, −10°. 112 feature rays are selected in each off-axial field, and 1568 feature rays that corresponds different pupil positions and different off-axial fields are selected.

Figure 8:
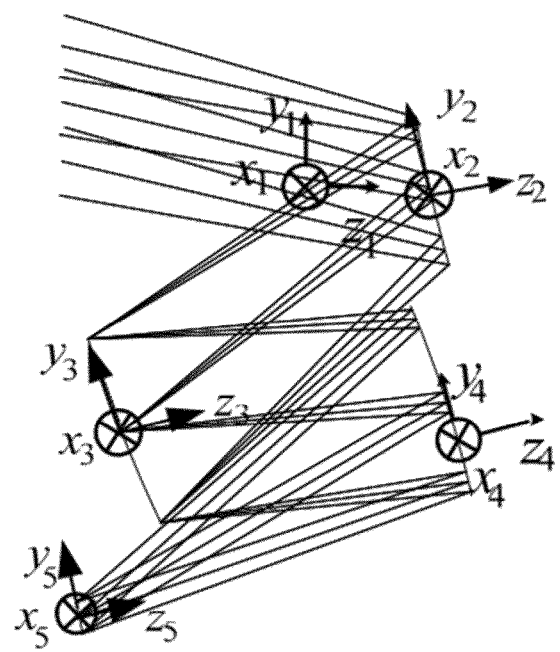
FIG. 8 is a position diagram of one embodiment of a primary mirror, a secondary mirror and a tertiary mirror of an off-axis hybrid surface three-mirror optical system.

Referring to FIG. 8, a first three-dimensional rectangular coordinates system $(x_1, y_1, z_1)$ is defined in space. A $z_1$-axis is along an horizontal line, in the $z_1$-axis, to the left is negative, and to the right is positive. A $y_1$-axis is in a direction substantially perpendicular to the $z_1$-axis, in the $y_1$-axis, to the upward is positive, and to the downward is negative. An $x_1$-axis is perpendicular to a $y_1 z_1$ plane, in the $x_1$-axis, in a direction substantially perpendicular to the $y_1z_1$ plane, to the inside is positive, and to the outside is negative.

In space relative to the first three-dimensional rectangular coordinates system $(x_1, y_1, z_1)$, a second three-dimensional rectangular coordinates system $(x_2, y_2, z_2)$ is defined by a primary mirror location, a third three-dimensional rectangular coordinates system $(x_3, y_3, z_3)$ is defined by a secondary mirror location, a fourth three-dimensional rectangular coordinates system $(x_4, y_4, z_4)$ is defined by a tertiary mirror location, and a fifth three-dimensional rectangular coordinates system $(x_5, y_5, z_5)$ is defined by an image sensor location.

A second origin of the second three-dimensional rectangular coordinates system $(x_2, y_2, z_2)$ is in (0, 244.51, 193.62) position of the first three-dimensional rectangular coordinates system $(x_1, y_1, z_1)$, whose unit is millimeter. A $z_2$-axis positive direction rotates about 13.39 degrees along a counterclockwise direction relative to a $z_1$-axis positive direction.

A third origin of the third three-dimensional rectangular coordinates system $(x_3, y_3, z_3)$ is in (0, 0, −100) position of the first three-dimensional rectangular coordinates system $(x_1, y_1, z_1)$, whose unit is millimeter. A $z_3$-axis positive direction rotates about 15 degrees along a counterclockwise direction relative to a $z_1$-axis positive direction.

A fourth origin of the fourth three-dimensional rectangular coordinates system $(x_4, y_4, z_4)$ is in (0, −160.83, 209.49) position of the first three-dimensional rectangular coordinates system $(x_1, y_1, z_1)$, whose unit is millimeter. A $z_4$-axis positive direction rotates about 0 degrees along a counterclockwise direction relative to a $z_1$-axis positive direction.

A fifth origin of the fifth three-dimensional rectangular coordinates system $(x_5, y_5, z_5)$ is in (0, −145.13, −174.41) position of the first three-dimensional rectangular coordinates system $(x_1, y_1, z_1)$, whose unit is millimeter. A $z_5$-axis positive direction rotates about 10 degrees along a counterclockwise direction relative to a $z_1$-axis positive direction.

A length of the off-axis hybrid surface three-mirror optical system 100 along the $y_1$-axis is about 430 millimeters. A length of the off-axis hybrid surface three-mirror optical system 100 along the $z_1$-axis is about 400 millimeters.

In the second three-dimensional rectangular coordinates system $(x_2, y_2, z_2)$; a reflective surface of the primary mirror 120 is a sixth-order polynomial freeform surface of $x_2y_2$, and the sixth-order polynomial freeform surface of $x_2y_2$ can be expressed as follows:

$$Z = \frac{cr^2}{1+\sqrt{1-(1+k)c^2r^2}} + b_1y + b_2x^2 + b_3y^2 + b_4x^2y + b_5y^3 +$$
$$b_6x^4 + b_7x^2y^2 + b_8y^4 + b_9x^6 + b_{10}x^4y^2 + b_{11}x^2y^4 + b_{12}y^6$$
$$r^2 = x^2 + y^2,$$

wherein, z represents surface sag, c represents surface curvature, k represents conic constant, while $b_i$ (i=1, 2, ..., 11, 12) represents the ith term coefficient. In one embodiment, c=4.57e-04, k=0.048, $1)_1$=0.0951, $b_2$=5.26e-06, $b_3$=7.90e-05, $b_4$=3.41e-07, $b_5$=3.97e-07, $b_6$=5.54e-10, $b_7$=1.29e-09, $b_8$=6.84e-10, $b_9$=0, $b_{10}$=0, $b_{12}$=0.

In the third three-dimensional rectangular coordinates system $(x_3, y_3, z_3)$, the reflective surface of the secondary mirror 104 is a sixth-order polynomial aspheric surface of $x_3y_3$. The sixth-order polynomial aspheric surface of $x_3y_3$ can be expressed as follows:

$$Z = \frac{cr^2}{1+\sqrt{1-(1+k)c^2r^2}} + a_1r^4 + a_2r^6 \quad r^2 = x^2 + y^2,$$

wherein z represents surface sag, c represents surface curvature, k represents conic constant, a1 and a2 are polynomial coefficients. In one embodiment, c=5.73e-04, k=0, $a_1$=1.21e-12, $a_2$=−8.85e-16.

In the fourth three-dimensional rectangular coordinates system $(x_4, y_4, z_4)$, the reflective surface of the tertiary mirror 106 is a spherical surface of $x_4y_4$, and the spherical surface of $x_4y_4$ can be expressed as $(x-A)^2+(y-B)^2+(z-C)^2=r^2$. In one embodiment, A=0, B=−160.83, C=209.49, r=−988.48.

In other embodiments, the values of c, k, and $A_i$ in the sixth-order polynomial freeform surface of $x_2y_2$, the values of z, c, k, $a_1$ and $a_2$ of sixth-order polynomial aspheric surface of $x_3y_3$, and the values of A, B, C and r of the spherical surface of $x_4y_4$ can be selected according to actual needs.

Figure 9:
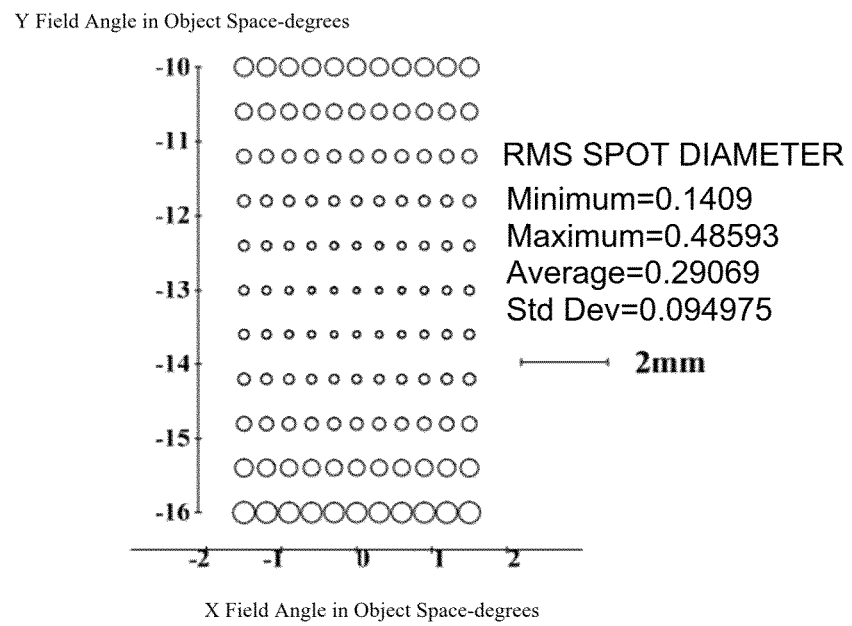
FIG. 9 shows average RMS spot diameters of one embodiment of an off-axis hybrid surface three-mirror optical system.

Referring to FIG. 9, the RMS spot diameters of the off-axis hybrid surface three-mirror optical system 100 is shown. It can be seen that an average value of the RMS spot diameters is about 0.296 mm. It shows that the RMS spot diameters of the off-axis hybrid surface three-mirror optical system 100 is small, therefore the off-axis hybrid surface three-mirror optical system 100 can be used as a good initial structure for subsequent optimization.

The off-axis hybrid surface three-mirror optical system 100 can be optimized to improve the imaging quality and reduce the relative distortion. The off-axis hybrid surface three-mirror optical system is used as the initial structure for subsequent optimization. In one embodiment, the off-axis hybrid surface three-mirror optical system 100 is optimized via a CODEV software. In one embodiment, after the off-axis hybrid surface three-mirror optical system 100 is optimized, in the sixth-order polynomial freeform surface of $x_2y_2$, c=5.54e-04, k=90.31, $b_1$=0, $b_2$=0.0003, $b_3$=0.0005, $b_4$=9.07e-07, $b_5$=1.03e-06, $b_6$=−2.37e-10, $b_7$=9.88e-10, $b_8$=1.31e-09, $b_9$=−4.64e-14, $b_{10}$=−1.91e-13, $b_{11}$=−2.05e-13 $b_{12}$=−7.56e-14; in the sixth-order polynomial aspheric surface of $x_3y_3$, c=9.19e-04, k=0, $\alpha_i$=−4.49e-11, $\alpha_2$=−1.35e-15; in the spherical surface of $x_4y_4$, A=0, B=−266.75, C=313.84, r=−996.65.

In one embodiment, after the off-axis hybrid surface three-mirror optical system 100 is optimized, the second origin of the second three-dimensional rectangular coordinates system $(x_2, y_2, z_2)$ is in (0, 18.57, 274.09) position of the first three-dimensional rectangular coordinates system $(x_1, y_1, z_1)$, whose unit is millimeter. A $z_2$-axis positive direction rotates about 7.63 degrees along a counterclockwise direction relative to a $z_1$-axis positive direction. A third origin of the third three-dimensional rectangular coordinates system $(x_3, y_3, z_3)$ is in (0, −227.00, −48.81) position of the first three-dimensional rectangular coordinates system $(x_1, y_1, z_1)$, whose unit is millimeter. A $z_3$-axis positive direction rotates about 18.03 degrees along a counterclockwise direction relative to a $z_1$-axis positive direction. A fourth origin of the fourth three-dimensional rectangular coordinates system $(x_4, y_4, z_4)$ is in (0, −266.75, 313.84) position of the first three-dimensional rectangular coordinates system $(x_1, y_1, z_1)$, whose unit is millimeter. A $z_4$-axis positive direction rotates about 10.77 degrees along a counterclockwise direction relative to a $z_1$-axis positive direction. A fifth origin of the fifth three-dimensional rectangular coordinates system $(x_5, y_5, z_5)$ is in (0, −365.47, −27.10) position of the first three-dimensional rectangular coordinates system ($x_1$, $y_1$, $z_1$), whose unit is millimeter. A $z_5$-axis positive direction rotates about 9.74 degrees along a counterclockwise direction relative to a $z_1$-axis positive direction.

Figure 10:
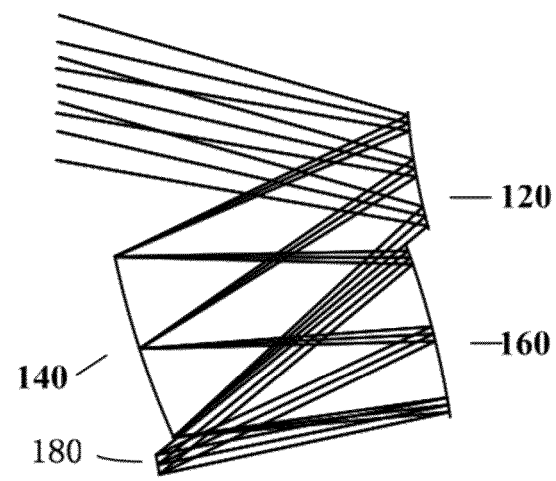
FIG. 10 shows a light path schematic view of one embodiment of an off-axis hybrid surface three-mirror optical system after optimization.

Referring to FIG. 10, a light path schematic view of the off-axis hybrid surface three-mirror optical system 100 after optimization is shown. It is shown that the plurality of feature rays $R_i$ (i=1, 2 . . . K) from different fields and different aperture positions substantially focus on the ideal target point, the image quality is improved.

Figure 11:
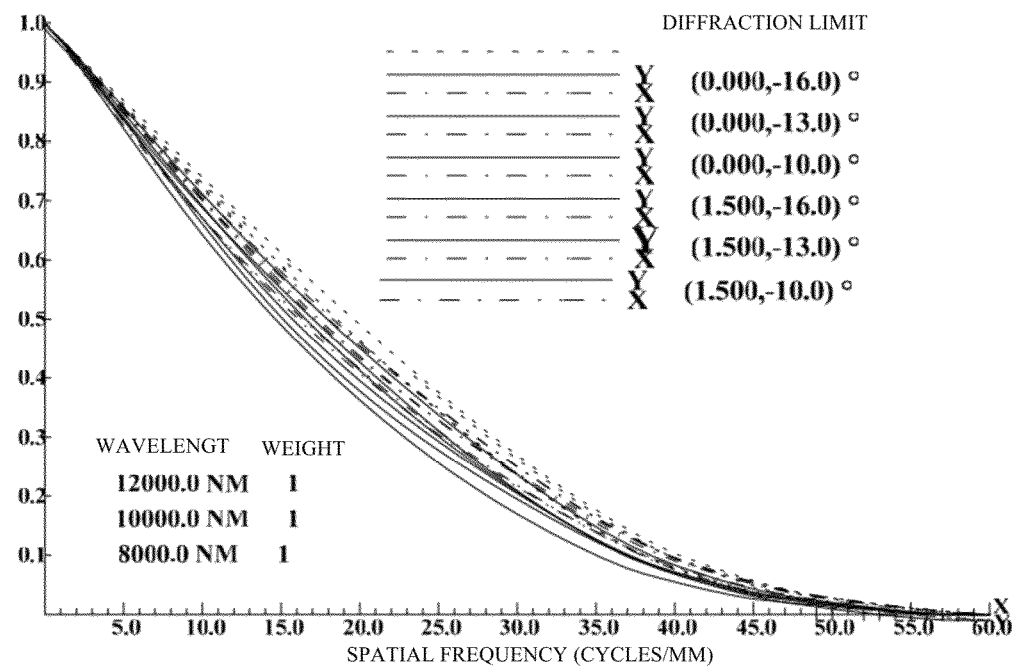
FIG. 11 shows a modulation transfer function (MTF) curve of one embodiment of an off-axis hybrid surface three-mirror optical system after optimization.

FIG. 11 illustrates that a modulation transfer functions (MTF) in visible light band of partial field angles of the hybrid surface three-mirror optical system 100 after optimization are closes to the diffraction limitation, and the image quality is further improved.

Figure 12:
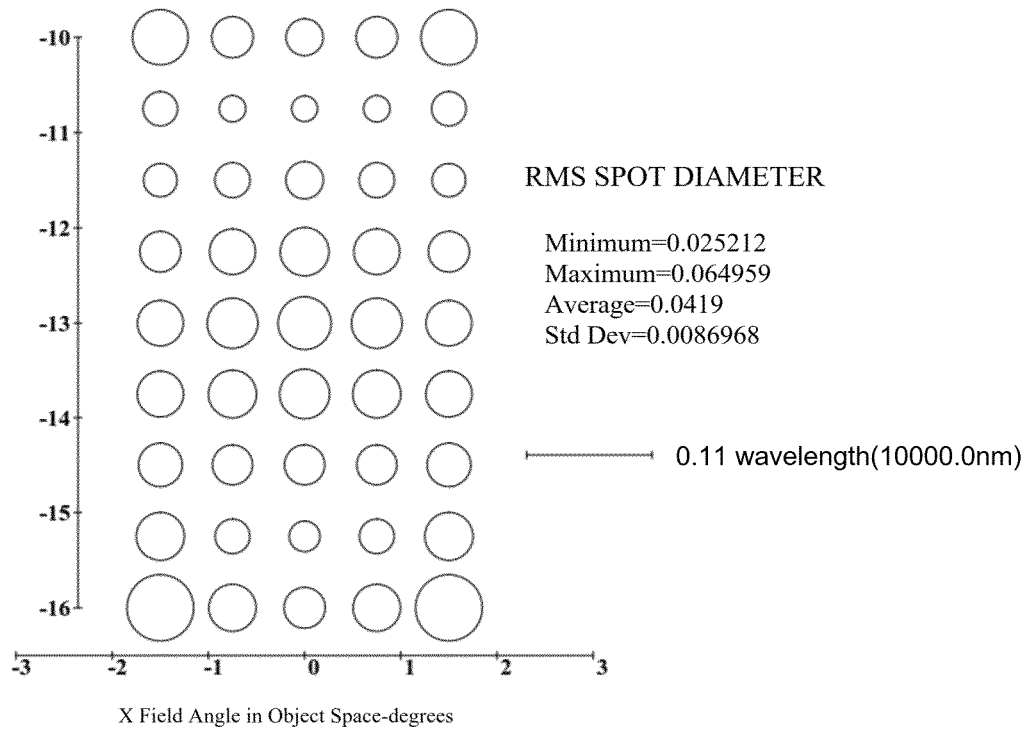
FIG. 12 shows a RMS wavefront error diagram of one embodiment of an off-axis hybrid surface three-mirror optical system after optimization.

Referring to FIG. 12, it can be seen that the average root mean square (RMS) of the pixel spot of the hybrid surface three-mirror optical system 100 after optimization is about $0.042\lambda$, wherein $\lambda=10000$ nm, which meets the design requirements.

An effective entrance pupil diameter of the hybrid surface three-mirror optical system 100 is about 100 millimeter.

The hybrid surface three-mirror optical system 100 adopts an off-axis field of view in a vertical direction. A field angle of the hybrid surface three-mirror optical system 100 is about 3°×6°, wherein an angle in an horizontal direction is in a range from about −1.5° to about 1.5°, and an angle in the vertical direction is in a range from about −16° to about −10°.

A wavelength of the hybrid surface three-mirror optical system 100 is not limited, in one embodiment, the wavelength is in a range from about 8 microns to about 12 microns.

An effective focal length (EFL) of the hybrid surface three-mirror optical system 100 is about 220 millimeters.

F-number of the hybrid surface three-mirror optical system 100 is a D/f reciprocal. In one embodiment, the relative aperture (D/f) of the hybrid surface three-mirror optical system 100 is about 0.45, and the F-number is about 2.2.

The method for designing hybrid surface three-mirror optical system can have many advantages. First, the method is calculated directly in an off-axis state, an error produced during a process from the coaxial system transformed into the off-axis system can be avoided, thus, a deviation between the off-axis hybrid surface optical system obtained by the above method and an ideal optical system is small. Second, during calculating the spherical surface optical system, the surface fitting process is combined with the data point calculating process, the unknown surface is calculated by repeating the process of data point calculating-spherical surface fitting, which improve the accuracy of the method. Third, the optical power of the spherical surface is changed by changing the radius of the spherical surface, then the remaining spherical surface is calculated to compensate for changed optical power. Therefore, an optical power distribution of the spherical surface optical system is more uniform, and the spherical surface optical system can be a better initial system for the following steps. Fourth, the global coordinate system and the local coordinate system are defined, the coordinates and the normal vector of the plurality of feature data points in the global coordinate system are transformed into the local coordinate system, then the aspheric surfaces are obtained by surface fitting in the local coordinate system, thus, the method is more precisely compared to conventional methods. Fifth, when surface fitting the second plurality of feature data points and the third plurality of feature data points, both the coordinates and the normal vectors of the second plurality of feature data points and the third plurality of feature data points are considered; therefore, the shape of the freeform surface and shape of the aspheric surfaces are accurate. Finally, the point-by-point design method can be used to design hybrid surface systems comprise different surfaces, increasing the diversity of optical designs.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

What is claimed is:

1. A method for making an off-axis hybrid surface optical system, comprising:
   step (S1), establishing a first initial system, wherein the first initial system comprises a plurality of initial surfaces, and each of the plurality of initial surfaces corresponds to a surface of the off-axis hybrid surface optical system; and selecting a plurality of feature rays $R_i$ (i=1, 2 . . . K) from different fields and different aperture positions;
   step (S2), step (S2a), defining a spherical surface of the off-axis hybrid surface optical system to be calculated as a spherical surface "a", keeping the plurality of initial surfaces unchanged and calculating a plurality of first feature data points ($P_1$, $P_2$, . . . $P_m$) point by point, wherein m is less than K, and the plurality of first feature data points ($P_1$, $P_2$, . . . $P_m$) are m first intersection points of the spherical surface "a" and m of the plurality of feature rays $R_i$ (i=1, 2 . . . K); and surface fitting the plurality of first feature data points ($P_1$, $P_2$, . . . $P_m$) to obtain an initial spherical surface $A_m$; step (S2b), calculating a (m+1)th first feature data point $P_{m+1}$ based on the initial spherical surface $A_m$, wherein a global coordinate system is defined by a primary mirror location, a beam propagation direction is defined as a Z-axis, and a plane perpendicular to the Z-axis is defined as an xy plane; a tangent plane $T_m$ at a first feature data point $P_m$ is calculated, the tangent plane $T_m$ intersects with the initial spherical surface $A_m$ at an intersection line $L_m$; and in the global coordinate system, a first feature data point located on the intersection line $L_m$ whose x coordinate is the same as an x coordinate of the first feature data point $P_m$ is defined as a intermediate point $G_m$, and surface fitting the (m+1) first feature data points ($P_1$, $P_2$, . . . $P_m$, $P_{m+1}$) to obtain a spherical surface $A_{m+1}$ using the intermediate point $G_m$; step (S2c), repeating steps from step (S2a) to step (S2b) until a Kth first feature data point $P_K$ is obtained, and surface fitting the first feature data points ($P_1$, $P_2$, . . . $P_K$) to obtain a spherical surface $A_K$, wherein the spherical surface $A_K$ is the spherical surface "a"; step (S2d), repeating steps from step (S2a) to step (S2c) until all spherical surfaces of the off-axis hybrid surface optical system are obtained, and a spherical surface optical system is obtained;
   step (S3), step (S3a), defining an aspheric surface of the off-axis hybrid optical system to be calculated as an aspheric surface "b", the spherical surface optical system being a second initial system, keeping all spherical surfaces of the spherical optical system unchanged and calculating a plurality of second feature data points ($P'_1$, $P'_2$, ... $P'_K$), wherein the plurality of second feature data points ($P'_1$, $P'_2$, ... $P'_K$) are K second intersection points of the spherical surface "a" and the plurality of feature rays $R_i$ (i=1, 2 ... K); and step (S3b), surface fitting the plurality of second feature data points ($P'_1$, $P'_2$, ... $P'_K$) to obtain the aspheric surface "b"; repeating steps from step (S3a) to step (S3b) until all aspheric surfaces of the off-axis hybrid surface optical system are obtained, and a first hybrid surface optical system is obtained;

step (S4), step (S4a), defining a freeform surface of the off-axis hybrid optical system as a freeform surface "c", the first hybrid surface optical system being a third initial system, and keeping all aspheric surfaces of the first hybrid surface optical system unchanged and calculating a plurality of third feature data points ($P''_1$, $P''_2$, ... $P''_K$), wherein the plurality of third feature data points ($P''_1$, $P''_2$, ... $P''_K$) are K third intersection points of the aspheric surface "b" and the plurality of feature rays $R_i$ (i=1, 2 ... K); and step (S4b), surface fitting the plurality of third feature data points ($P''_1$, $P''_2$, ... $P''_K$) to obtain the freeform surface "c"; repeating steps from step (S4a) to step (S4b) until all freeform surfaces of the off-axis hybrid surface optical system are obtained; and step (S5), making a hybrid surface optical system comprising a primary mirror, a secondary mirror and a tertiary mirror based on the spherical surfaces obtained in step (S2), the aspheric surfaces obtained in step (S3) and the freeform surfaces obtained in step (S4).

2. The method as claimed in claim 1, wherein a method for calculating the plurality of first feature data points ($P_1$, $P_2$, ... $P_m$) comprises:

Step (a): defining the first intersection point of a first feature ray $R_1$ and the spherical surface "a" as a first feature data point $P_1$;

Step (b): an ith (1≤i≤m−1) first feature data point $P_i$ (1≤i≤m−1) has been obtained, a unit normal vector $\vec{N}_i$ at the ith (1≤i≤m−1) first feature data point $P_i$ (1≤i≤m−1) is calculated based on a vector form of Snell's Law;

Step (c): making a first tangent plane through the ith (1≤i≤m−1) first feature data point $P_i$ (1≤i≤m−1); and (m−i) fourth intersection points are obtained by the first tangent plane intersects with remaining (m−i) feature rays; a fourth intersection point $Q_{i+1}$, which is nearest to the ith (1≤i≤m−1) feature data point $P_i$ (1≤i≤m−1), is fixed; and a feature ray corresponding to the fourth intersection point $Q_{i+1}$ is defined as $R_{i+1}$, a shortest distance between the fourth intersection point $Q_{i+1}$ and the ith (1≤i≤m−1) first feature data point $P_i$ (1≤i≤m−1) is defined as $d_i$;

Step (d): making a second tangent plane at each of the (i−1) first feature data points that are obtained before the ith first feature data point $P_i$ (1≤i≤m−1) respectively; thus, (i−1) second tangent planes are obtained, and (i−1) fifth intersection points are obtained by the (i−1) second tangent planes intersecting with a feature ray $R_{i+1}$; in each of the (i−1) second tangent planes, each of the fifth intersection points and its corresponding feature data point form an intersection pair; the intersection pair, which has the shortest distance between a fifth intersection point and its corresponding feature data point, is fixed; and the fifth intersection point and the shortest distance is defined as and d', respectively;

Step (e): comparing $d_i$ and $d'_i$, if $d_i \leq d'_i$, $Q_{i+1}$ is taken as the next first feature data point $P_{i+1}$ (1≤i≤m−1); otherwise, $Q'_{i+1}$ is taken as the next first feature data point $P_{i+1}$ (1≤i≤m−1); and Step (f): repeating steps from step (b) to step (e), until the plurality of first feature data points $P_i$ (i=1, 2 ... m) are all calculated.

3. The method as claimed in claim 1, wherein a method for calculating a (m+1)th first feature data point $P_{m+1}$ comprises:

finding a feature ray $R_{m+1}$ corresponding to the (m+1)th first feature data point $P_{m+1}$, wherein a feature ray $R_{m+1}$ is nearest to the intermediate point $G_m$ in remaining K−m characteristic rays;

finding a first feature data point closest to the first feature data point $P_{m+1}$ from the plurality of first feature data points ($P_1$, $P_2$, ... $P_m$); and calculating a sixth intersection point between the feature ray $R_{m+1}$ and a tangent plane of the first feature data point closest to the first feature data point $P_{m+1}$, wherein the sixth intersection point is the (m+1)th first feature data point $P_{m+1}$.

4. The method as claimed in claim 3, wherein a method for finding the feature ray $R_{m+1}$ corresponding to the (m+1)th feature data point $P_{m+1}$ comprises: a normal vector $n_m$ and a tangent plane of the intermediate point $G_m$ at the initial spherical surface $A_m$ are obtained according to an spherical surface expression; (K−m) intersection points are obtained by a tangent plane of the intermediate point $G_m$ intersecting with remaining (K−m) feature rays; an intersection point $O_m$, which is nearest to the intermediate point $G_m$ is fixed from the (K−m) intersection points; and the feature ray where the intersection point $O_m$ is located on is the feature ray $R_{m+1}$.

5. The method as claimed in claim 3, wherein a method for calculating the sixth intersection point between the feature ray $R_{m+1}$ and the tangent plane of the feature data point closest to the first feature data point $P_{m+1}$ comprises: m intersection points $O_i$ (1≤i≤m) are obtained by the feature ray $R_{m+1}$ intersects with each of the tangent planes of the first feature data points ($P_1$, $P_2$ ... $P_m$), and an intersection point $G'_m$ is obtained by the feature ray $R_{m+1}$ intersects with the intermediate point $G_m$; the plurality of first feature data points ($P_1$, $P_2$ ... $P_m$) and the intermediate point $G_m$ are defined as "F", and the m intersection points $O_i$ (1≤i≤m) and the intersection point $G'_m$ are defined as "F'"; and a pair of (F−F') which has shortest distance is fixed from ($P_1$, $P_2$ ... $P_m$)−$O_i$ and $G'_m$−$G_m$, F is closest to the first feature data point $P_{m+1}$, and F' is the (m+1)th first feature data point $P_{m+1}$.

6. The method as claimed in claim 1, wherein a method for obtaining the initial spherical surface $A_m$ comprises:

Step (S21): defining a coordinate of a first feature data point as ($x_i$, $y_i$, $z_i$), a normal vector corresponding to ($x_i$, $y_i$, $z_i$) as ($u_i$, $v_i$, −1), a sphere center as (A, B, C) and a radius as r, an equation of the spherical surface $A_m$ is expressed by a first equation:

$$(x_i-A)^2+(y_i-B)^2+(z_i-C)^2=r^2;$$

Step (S22): calculating a derivation of the first equation for x and y, to obtain a second expression of a normal vector $u_i$ in an x-axis direction and a third expression of a normal vector $v_i$ in a y-axis direction, wherein the second expression is $$\left(1+\frac{1}{u_i^2}\right)(x_i-A)^2+(y_i-B)^2=r^2,$$

and the third expression is $$(x_i-A)^2+\left(1+\frac{1}{v_i^2}\right)(y_i-B)^2=r^2;$$

Step (S23): rewriting the first expression, the second expression and the third expression into a matrix form, to obtain a fourth expression, a fifth expression, and a sixth expression, wherein the fourth expression is $$\begin{bmatrix} \Sigma(x_i(x_i-\bar{x})) & \Sigma(x_i(y_i-\bar{y})) & \Sigma(x_i(z_i-\bar{z})) \\ \Sigma(x_i(y_i-\bar{y})) & \Sigma(y_i(y_i-\bar{y})) & \Sigma(y_i(z_i-\bar{z})) \\ \Sigma(x_i(z_i-\bar{z})) & \Sigma(y_i(z_i-\bar{z})) & \Sigma(z_i(z_i-\bar{z})) \end{bmatrix}\begin{bmatrix} 2A \\ 2B \\ 2C \end{bmatrix} = \begin{bmatrix} \Sigma((x_i^2+y_i^2+z_i^2)(x_i-\bar{x})) \\ \Sigma((x_i^2+y_i^2+z_i^2)(y_i-\bar{y})) \\ \Sigma((x_i^2+y_i^2+z_i^2)(z_i-\bar{z})) \end{bmatrix},$$

the fifth expression is $$\begin{bmatrix} \Sigma U_i(U_i-\bar{U}) & \Sigma U_i(y_i-\bar{y}) & 0 \\ \Sigma U_i(y_i-\bar{y}) & \Sigma y_i(y_i-\bar{y}) & 0 \\ 0 & 0 & 0 \end{bmatrix}\begin{bmatrix} 2A \\ 2B \\ 2C \end{bmatrix} = \begin{bmatrix} \Sigma(U_i x_i+y_i^2)(U_i-\bar{U}) \\ \Sigma(U_i x_i+y_i^2)(y_i-\bar{y}) \\ 0 \end{bmatrix},$$

and the sixth expression is $$\begin{bmatrix} \Sigma x_i(x_i-\bar{x}) & \Sigma V_i(x_i-\bar{x}) & 0 \\ \Sigma V_i(x_i-\bar{x}) & \Sigma V_i(V_i-\bar{V}) & 0 \\ 0 & 0 & 0 \end{bmatrix}\begin{bmatrix} 2A \\ 2B \\ 2C \end{bmatrix} = \begin{bmatrix} \Sigma(x_i^2+V_i y_i)(x_i-\bar{x}) \\ \Sigma(x_i^2+V_i y_i)(V_i-\bar{V}) \\ 0 \end{bmatrix};$$

and

Step (S24): obtaining the sphere center (A, B, C) by the fourth expression+ω×the fifth expression+ω×the sixth expression, and obtaining the radius r by the first expression+ω×the second expression+ω×the third expression, wherein ω is a weight of a normal error.

7. The method as claimed in claim 1, wherein after step (S2), a first radius of each of the spherical surfaces of the off-axis hybrid surface optical system is changed to obtain new spherical surfaces.

8. The method as claimed in claim 7, wherein $r_a'=\varepsilon_a \times r_a$, $\varepsilon_a = 0.5 \sim 1.5$, $r_a$ is the first radius of each of the spherical surfaces of the off-axis hybrid surface optical system, and $r_a'$ is a second radius of each of the new spherical surfaces.

9. The method as claimed in claim 1, wherein both a coordinate error and a normal error during the surface fitting the plurality of second feature data points ($P'_1, P'_2, \ldots P'_K$) are considered.

10. The method as claimed in claim 9, wherein a unit normal vector of each of the plurality of second feature data points ($P'_1, P'_2, \ldots P'_K$) is obtained based on an object-image relationship, and the coordinates and normal of the plurality of second feature data points ($P'_1, P'_2, \ldots P'_K$) are surface fitted.

11. The method as claimed in claim 1, wherein both a coordinate error and a normal error during the surface fitting the plurality of third feature data points ($P''_1, P''_2, \ldots P''_K$) are considered.

12. The method as claimed in claim 11, wherein a unit normal vector of each of the plurality of third feature data points ($P''_1, P''_2, \ldots P''_K$) is obtained based on an object-image relationship, and the coordinates and normal of the plurality of third feature data points ($P'_1, P'_2, \ldots P'_K$) are surface fitted.

13. The method as claimed in claim 1, wherein a method for surface fitting the plurality of third feature data points ($P''_1, P''_2, \ldots P''_K$) comprises:

step (S41), surface fitting the plurality of third feature data points to a sphere in the global coordinate system; and obtaining a curvature c of the sphere and a curvature center ($x_c$, $y_c$, $z_c$) corresponding to the curvature c of the sphere;

step (S42), defining a feature data point ($x_o$, $y_o$, $z_o$) corresponding to a chief ray of a central field angle among an entire field-of-view as a vertex of the sphere, defining a local coordinate system by the vertex of the sphere as origin and a line passing through the curvature center and the vertex of the sphere as a Z-axis;

step (S43), transforming a plurality of coordinates ($x_i$, $y_i$, $z_i$) and plurality of normal vector ($\alpha_i$, $\beta_i$, $\gamma_i$), of the plurality of third feature data points in the global coordinate system, into plurality of coordinates ($x'_i$, $y'_i$, $z'_i$) and plurality of normal vector ($\alpha'_i$, $\beta'_i$, $\gamma'_i$), of the plurality of third feature data points in the local coordinate system;

step (S44), surface fitting the plurality of third feature data points into a conic surface in the local coordinate system, based on the plurality of coordinates ($x'_i$, $y'_i$, $z'_i$) and the curvature c of the sphere, and obtaining a conic constant k; and step (S45), removing the plurality of coordinates and the plurality of normal vector of the plurality of third feature data points $P_i$ ($i=1, 2 \ldots K$), on the conic surface in the local coordinate system, from the plurality of coordinates ($x'_i$, $y'_i$, $z'_i$) and the plurality of normal vector ($\alpha'_i$, $\beta'_i$, $\gamma'_i$), to obtain a plurality of residual coordinates and a plurality of residual normal vector; and surface fitting the plurality of residual coordinates and the plurality of residual normal vector to obtain a freeform surface; an equation of the freeform surface "c" is obtained by adding an conic surface equation and an freeform surface equation.

14. The method as claimed in claim 13, wherein a relationship between the plurality of coordinates ($x'_i$, $y'_i$, $z'_i$) and the plurality of coordinates ($x_i$, $y_i$, $z_i$) of the plurality of third feature data points is $$\begin{cases} x'_i = x_i - x_o \\ y'_i = (y_i - y_o)\cos\theta - (z_i - z_o)\sin\theta \\ z'_i = (y_i - y_o)\sin\theta + (z_i - z_o)\cos\theta \end{cases}.$$

15. The method as claimed in claim 13, wherein a relationship between the plurality of normal vector ($\alpha'_i$, $\beta'_i$, $\gamma'_i$) and the plurality of normal vector ($\alpha_i$, $\beta_i$, $\gamma_i$) of the plurality of third feature data points is $$\begin{cases} \alpha'_i = \alpha_i \\ \beta'_i = \beta_i \cos\theta - \gamma_i \sin\theta \\ \gamma'_i = \beta_i \sin\theta + \gamma_i \cos\theta \end{cases}.$$

\* \* \* \* \*